United States Patent
Ryu

(10) Patent No.: US 7,022,624 B2
(45) Date of Patent: Apr. 4, 2006

(54) SEMICONDUCTOR DEVICE AND METHOD OF FABRICATING THE SAME

(75) Inventor: Choon Kun Ryu, Seoul (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/740,352

(22) Filed: Dec. 18, 2003

(65) Prior Publication Data
US 2004/0262708 A1    Dec. 30, 2004

(30) Foreign Application Priority Data
Jun. 30, 2003    (KR) .................... 10-2003-0043410

(51) Int. Cl.
*H01L 21/31* (2006.01)
(52) U.S. Cl. .................... 438/786; 438/637; 438/788
(58) Field of Classification Search ............ 438/637, 438/786, 788
See application file for complete search history.

(56) References Cited

U.S. PATENT DOCUMENTS 6,262,445 B1 *  7/2001  Swanson et al. ............ 257/288
6,723,635 B1 *  4/2004  Ngo et al. .................. 438/627

FOREIGN PATENT DOCUMENTS

KR    2002-10073    2/2002
KR    2002-48720    6/2002

* cited by examiner

*Primary Examiner*—Alexander Ghyka
(74) *Attorney, Agent, or Firm*—Marshall, Gerstein & Borun LLP

(57) ABSTRACT

The present invention is provided to a semiconductor device and a method of fabricating the same. A spacer consisting of $SiC_xH_y$ or $SiOC_xH_y$ having a low dielectric constant is formed at the sidewall of a trench or a hole that is formed in an interlayer insulating film. It is therefore possible to reduce the dielectric constant while reducing critical dimension loss of the trench or the hole. Therefore, the present invention has advantages that it can enhance the operating speed of the device by minimizing parasitic capacitance and prohibiting RC delay and crosstalk.

8 Claims, 2 Drawing Sheets

SEMICONDUCTOR DEVICE AND METHOD OF FABRICATING THE SAME

BACKGROUND

1. Field of the Invention

The present invention relates to a semiconductor device and a method of fabricating the same and, more specifically, to a semiconductor device and a method of fabricating the same capable of reducing parasitic capacitance, especially between metal wirings.

2. Discussion of Related Art

Generally, as the distance between metal wirings due to narrowed level of integration in a device, an insulating film between the metal wirings serves as a dielectric film to cause parasitic capacitance. If parasitic capacitance is generated, there is a problem that a signal processing speed of the device is lowered since RC delay and crosstalk become severe.

Meanwhile, in case where a metal wiring is formed using a current damascene method, critical dimension loss is generated by a cleaning agent while a cleaning process is performed after an etch process is performed. This further increases parasitic capacitance. In order to prevent critical dimension loss from generating, a silicon nitride spacer is formed at the sidewall of a trench or a hole formed in an interlayer insulating film. Silicon nitride, however, has a high dielectric constant and is thus not completely removed by a cleaning agent. In the event that silicon nitride remains, there is a problem that an overall average dielectric constant between the metal wirings is increased although critical dimension loss is reduced.

SUMMARY OF THE INVENTION

The present invention is directed to a method of fabricating a semiconductor device capable of enhancing the operating speed of the device by minimizing parasitic capacitance and prohibiting RC delay and crosstalk, in such a way that a spacer consisting of SiCxHy or SiOCxHy having a low dielectric constant is formed at the sidewall of a trench or a hole formed in an interlayer insulating film, thereby reducing the dielectric constant while preventing critical dimension loss of the trench or the hole.

According to a preferred embodiment of the present invention, there is provided a semiconductor device, including a semiconductor substrate in which various elements for forming the semiconductor device are formed, an interlayer insulating film on the semiconductor substrate, a dual damascene pattern formed in the interlayer insulating film, and a SiCxHy film spacer formed at the sidewall of the dual damascene pattern.

One aspect of the present invention is to provide a semiconductor device, including a semiconductor substrate in which various elements for forming the semiconductor device are formed, an interlayer insulating film on the semiconductor substrate, a dual damascene pattern formed in the interlayer insulating film, and a SiOCxHy film spacer formed at the sidewall of the dual damascene pattern.

Another aspect of the present invention is to provide a method of fabricating a semiconductor device, including the steps of forming an interlayer insulating film on a semiconductor substrate in which various elements for forming the semiconductor device are formed, forming a contact hole in the interlayer insulating film, and forming a SiCxHy film spacer at the sidewall of the contact hole.

In the aforementioned of a method for fabricating a semiconductor device according to another embodiment of the present invention, the SiCxHy film spacer is formed by leaving the SiCxHy film only at the sidewall of the dual damascene pattern by means of a spacer etch process after forming the SiCxHy film on the entire surfaces of the structure. At this time, the SiCxHy film is formed using 3 MS or 4 MS. Also, the SiCxHy film is formed in PECVD equipment with a RF power of 100 W to 100 W at a temperature of 200° C. to 400° C. and a pressure of 1 to 10 Torr, while supplying an inert gas such as Ar or He.

In the aforementioned of a method for fabricating a semiconductor device according to another embodiment of the present invention, the method further includes the step of forming the SiCxHy film spacer into a SiOCxHy film. The SiOCxHy film is formed by plasma-processing the SiCxHy film spacer with a RF power of 100 W to 1000 W, while supplying an oxidant gas at a pressure of 1 to 10 Torr. At this time, the oxidant gas is $N_2O$.

DETAILED DESCRIPTION OF PREFERRED EMBODIMENTS

Figure 1A:
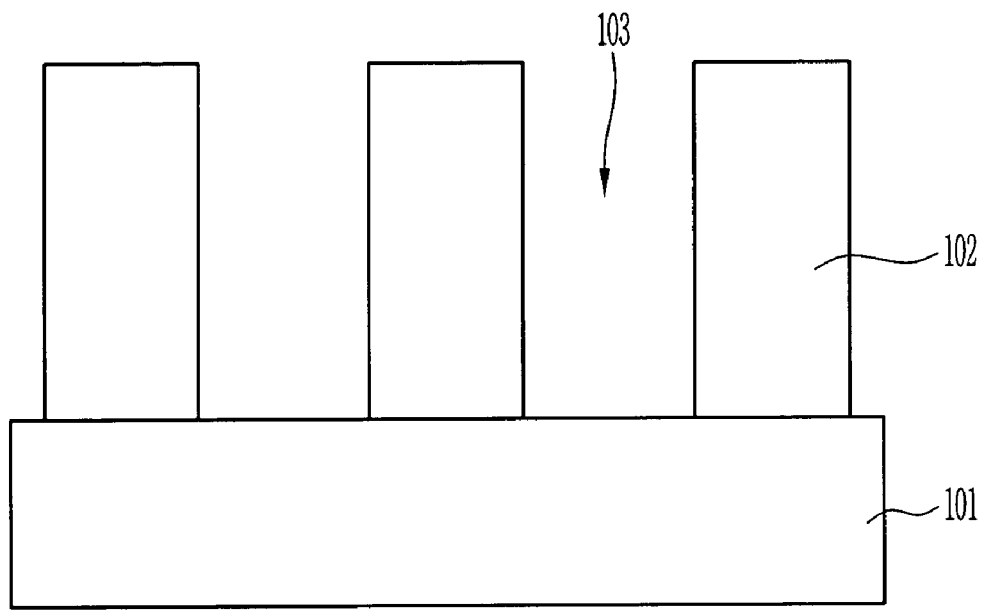
FIGS. 1A to 1D are cross-sectional views for explaining a method of fabricating a semiconductor device according to an embodiment of the present invention.

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Meanwhile, in case where it is described that one film is "on" the other film or a semiconductor substrate, the one film may directly contact the other film or the semiconductor substrate. A third film may be intervened between the one film and the other film or the semiconductor substrate. Further, in the drawing, the thickness and size of each layer are exaggerated for convenience of explanation and clarity. Like reference numerals are used to identify the same or similar parts.

FIGS. 1A to 1D are cross-sectional views for explaining a method of fabricating a semiconductor device according to an embodiment of the present invention.

Referring to FIG. 1A, an interlayer insulating film 102 is formed on a semiconductor substrate 101 in which various elements (not shown) for forming a semiconductor device are formed. A contact hole, a trench, or a dual damascene pattern consisting of the contact and the trench (shown as contact hole 103 in the drawing) are formed in the interlayer insulating film 102. In the above, various elements (not shown) for forming the semiconductor device may include a transistor, a flash memory device, a junction or a lower metal wiring.

Figure 1B:
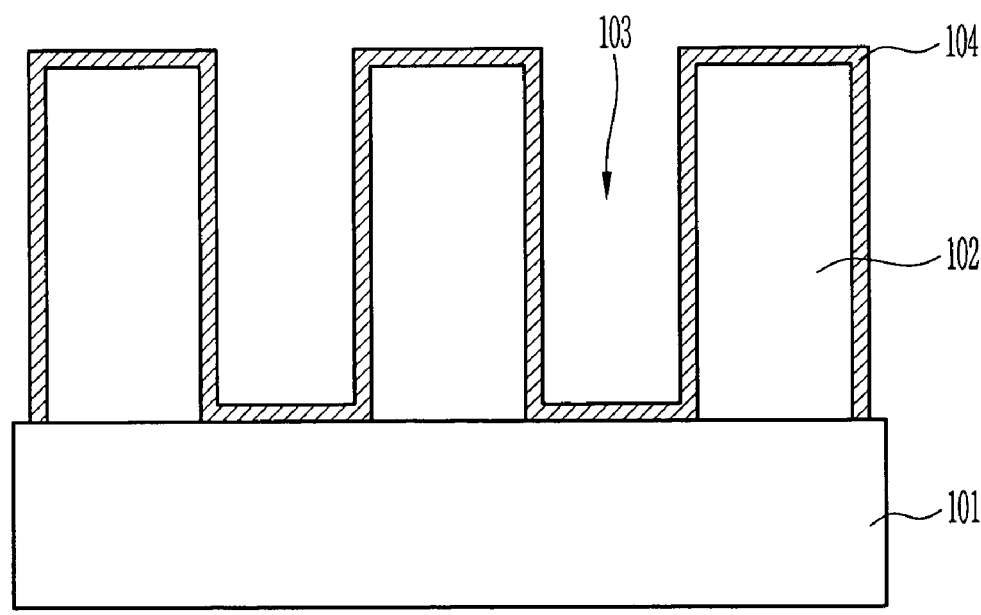

By reference to FIG. 1B, a SiCxHy film 104 is formed on the entire surfaces of the device. At this time, the SiCxHy film 104 may be formed in thickness of 50 Å to 200 Å using tri-methyl silane (3 MS) or tetra-methyl silane (4 MS). Meanwhile, the SiCxHy film 104 may be formed in PECVD equipment with a RF power of 100 W to 1000 W at a temperature of 200° C. to 400° C. and a pressure of 1 to 10 Torr while supplying an inert gas such as Ar or He. Then, the SiCxHy film 104 is formed by the reaction such as chemical equation 1 below Alkyl Silane (SiH(CH$_3$)$_3$ or SiH (CH$_3$)$_4$)+inert gas
(He or Ar)->SiCxHy+exhaust gas    [Equation 1]

Figure 1C:
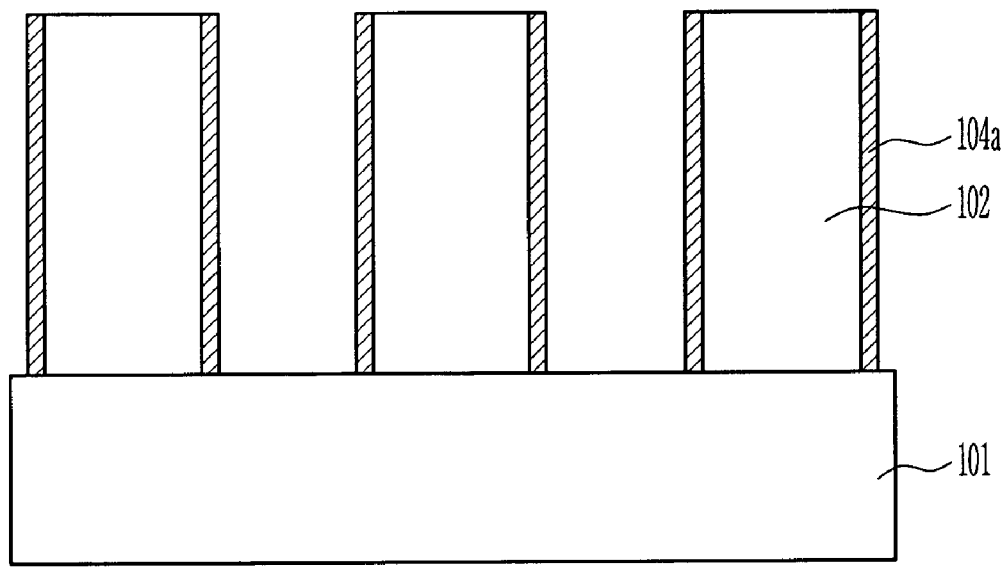

With reference to FIG. 1C, a spacer etch such as a blanket etch is performed to leave the SiCxHy film only at the sidewall of the contact hole 103, thus forming a SiCxHy film spacer 104a. Since the SiCxHy film has a different selective ratio from that of the interlayer insulating film 102, it can prevent the sidewall of the contact hole 103 from being etched, thereby preventing critical dimension loss. Furthermore, as the SiCxHy film has the dielectric constant of 4.0 to 4.5 similar to a silicon oxide film, it can prevent increase of the dielectric constant, thus preventing increase of parasitic capacitance.

Figure 1D:
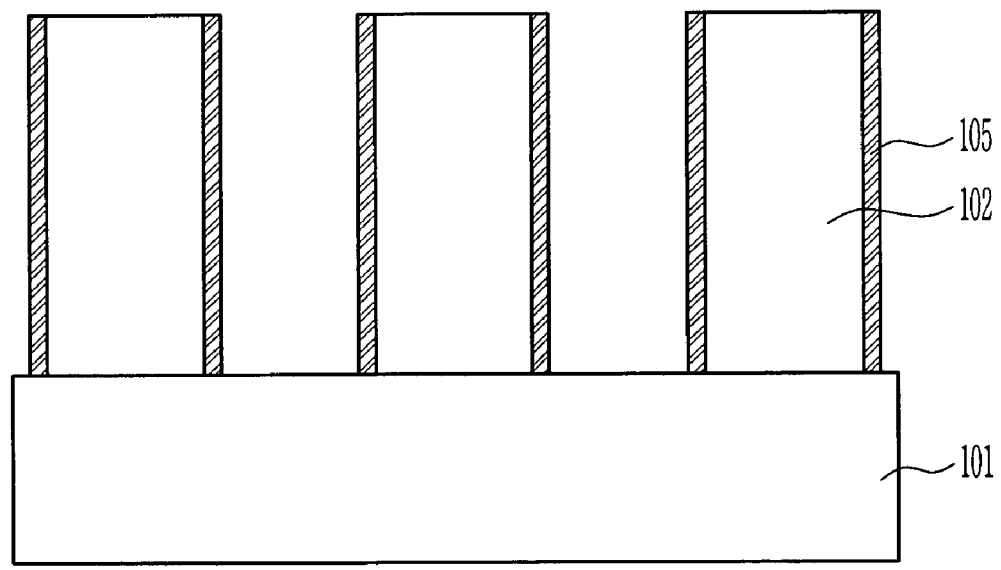

Referring to FIG. 1D, in order to further lower the dielectric constant, the SiCxHy film spacer (104a in FIG. 1C) may be formed using a SiOCxHy film 105. The SiOCxHy film 105 may be formed by plasma-processing the SiCxHy film spacer. The plasma processing may include applying a RF power of 100 W to 1000 W, while supplying an oxidant gas such as N$_2$O at a pressure of 1 to 10 Torr. At this time, the flow of the oxidant gas may be set to 500 sccm to 4000 sccm. The SiCxHy film spacer is therefore formed into the SiOCxHy film 105 by the reaction such as chemical equation 2 below.

SiCxHy+oxidant gas (N$_2$O)->SiOCxHy+exhaust gas    [Equation 2]

According to the present invention, by forming the SiOCxHy film 105 as above, it is possible to further reduce the dielectric constant since the dielectric constant of the SiOCxHy film is 2.7. Meanwhile, a cleaning process may be performed before the SiCxHy film is plasma-processed.

Moreover, according to the present invention, by forming a spacer consisting of SiCxHy or SiOCxHy having a low dielectric constant at the sidewall of a trench or a hole that is formed in an interlayer insulating film, it is possible to reduce the dielectric constant while reducing critical dimension loss of the trench or the hole. Therefore, the present invention has advantages that it can enhance the operating speed of the device by minimizing parasitic capacitance and prohibiting RC delay and crosstalk.

Furthermore, the SiCxHy film can be formed by installing only an alkyl silane gas lines in an existing PECVD equipment. It is therefore possible to significantly reduce the cost for investing equipments.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of fabricating a semiconductor device, comprising the steps of:
    forming an interlayer insulating film on a semiconductor substrate in which various elements for forming the semiconductor device are formed;
    forming a contact hole in the interlayer insulating film;
    forming a SiCxHy film spacer at the sidewall of the contact hole; and
    forming a SiOCxHy film by plasma-processing the SiCxHy film spacer.

2. The method as claimed in claim 1, wherein the SiCxHy film is formed in PECVD equipment with a RF power in the range of 100 W to 1000 W at a temperature of 200° C. to 400° C. and a pressure of 1 to 10 Torr, while supplying an inert gas such as Ar or He.

3. The method as claimed in claim 1, wherein the SiCxHy film spacer is formed by leaving the SiCxHy film only at the sidewall of the dual damascene pattern by means of a spacer etch process after forming the SiCxHy film on the entire surfaces of the structure.

4. The method as claimed in claim 3, wherein the SiCxHy film is formed in PECVD equipment with a RF power in the range of 100 W to 1000 W at a temperature of 200° C. to 400° C. and a pressure of 1 to 10 Torr, while supplying an inert gas such as Ar or He.

5. The method as claimed in claim 1, wherein the SiCxHy film is formed using 3 MS or 4 MS.

6. The method as claimed in claim 5, wherein the SiCxHy film is formed in PECVD equipment with a RF power in the range of 100 W to 1000 W at a temperature of 200° C. to 400° C. and a pressure of 1 to 10 Torr, while supplying an inert gas such as Ar or He.

7. The method as claimed in claim 1, wherein the plasma-processing is performed with a RF power of 100 W to 1000 W, while supplying an oxidant gas at a pressure of 1 to 10 Torr.

8. The method as claimed in claim 7, wherein the oxidant gas is N$_2$O.

* * * * *